United States Patent [19]

Muto

[11] Patent Number: 5,499,206

[45] Date of Patent: Mar. 12, 1996

[54] SEMICONDUCTOR OPTICAL MEMORY DEVICE FOR OPTICAL STORAGE OF INFORMATION WITH INCREASED RECORDING DENSITY

[75] Inventor: Shunichi Muto, Atsugi, Japan

[73] Assignee: Fujitsu Limited, Kawasaki, Japan

[21] Appl. No.: 156,979

[22] Filed: Nov. 24, 1993

Related U.S. Application Data

[63] Continuation of Ser. No. 635,434, Dec. 28, 1990, abandoned.

[30] Foreign Application Priority Data

Dec. 29, 1989 [JP] Japan .................................. 1-340420

[51] Int. Cl.$^6$ ........................................... G11C 13/04
[52] U.S. Cl. ........................... 365/114; 365/112; 365/215
[58] Field of Search ................................. 365/112, 114, 365/119, 215, 234, 151

[56] References Cited

U.S. PATENT DOCUMENTS

| | | | |
|---|---|---|---|
| 4,101,976 | 7/1978 | Castro et al. | 365/119 |
| 4,103,312 | 7/1978 | Chang et al. | 365/114 X |
| 4,855,950 | 8/1989 | Takada | 365/215 X |
| 4,864,536 | 9/1989 | Lindmayer | 365/119 |
| 4,933,926 | 6/1990 | Tabei et al. | 365/112 X |

FOREIGN PATENT DOCUMENTS 0316909  5/1989  European Pat. Off. .

OTHER PUBLICATIONS

Patent Abstracts of Japan, vol. 12, No. 453 (P-792), Nov. 29, 1988 & JP-A-63-177,131, Jul. 21, 1988.

*Primary Examiner*—Do Hyun Yoo
*Attorney, Agent, or Firm*—Nikaido, Marmelstein, Murray & Oram

[57] ABSTRACT

A semiconductor optical memory device includes a semiconductor layer formed with a plurality of elemental recording areas each having a size generally equal to a wavelength of the optical beam. A plurality of quantized regions are formed in each elemental recording area of the semiconductor layer. Each of the quantized regions has a quantized energy level and absorbing an optical radiation of which wavelength is pertinent to the quantized energy level of that quantized region by forming first type carriers having a first polarity and second type carriers having a second, opposing polarity. Each of the quantized regions includes a semiconductor material confined in at least two mutually perpendicular directions to form the quantized energy level and has the optical absorption wavelength that is different from that of other quantized regions included in each elemental recording area.

10 Claims, 11 Drawing Sheets

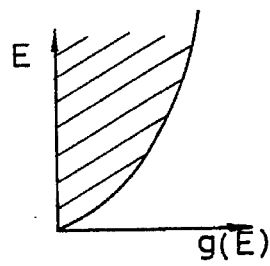
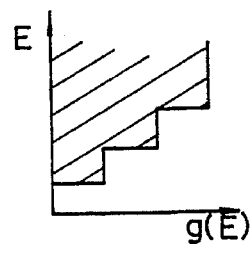
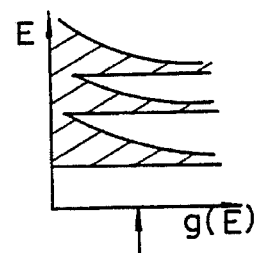
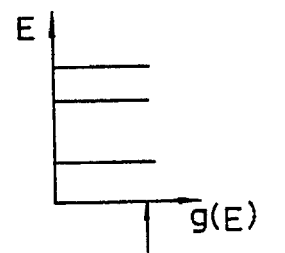
FIG.2A   FIG.2B
FIG.2C   FIG.2D

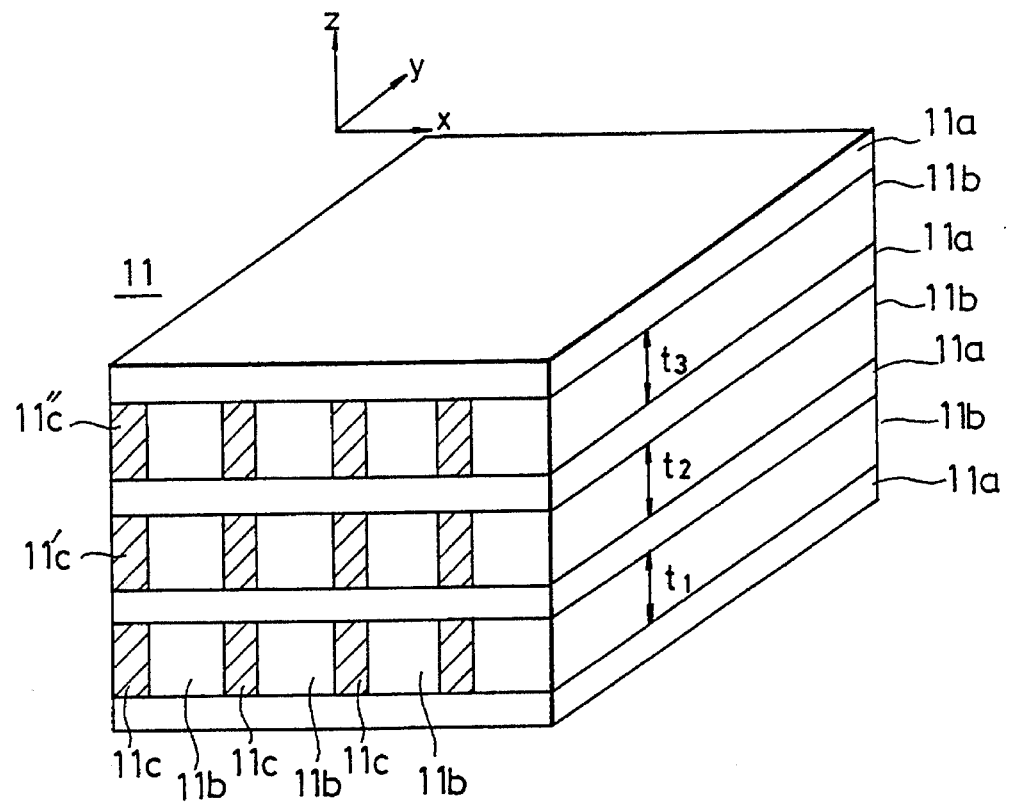
FIG. 7A
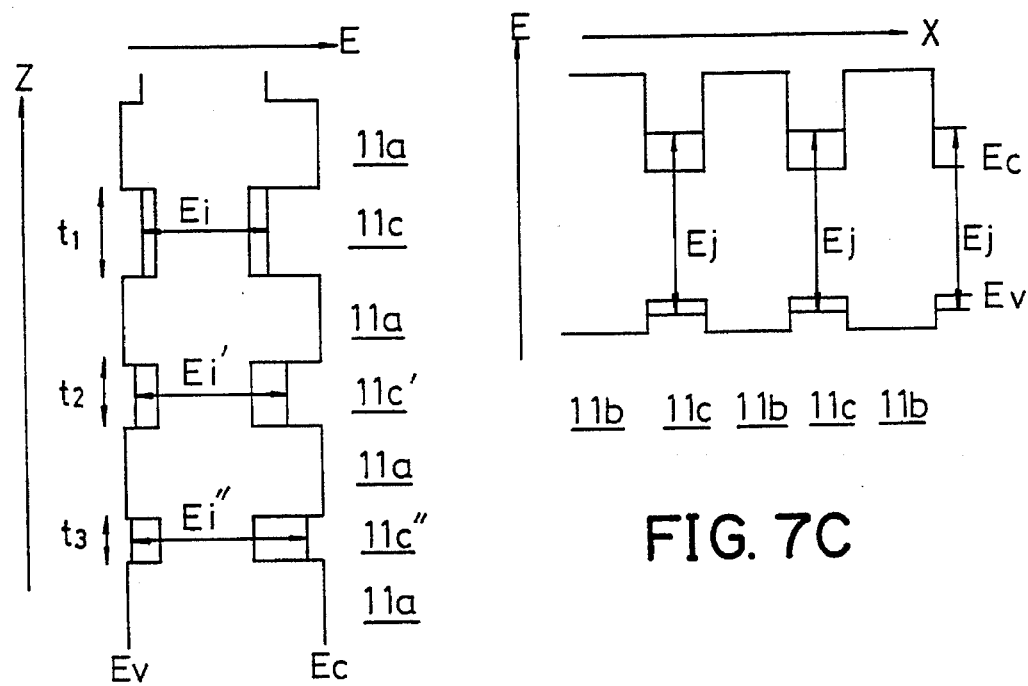
FIG. 7B
FIG. 7C

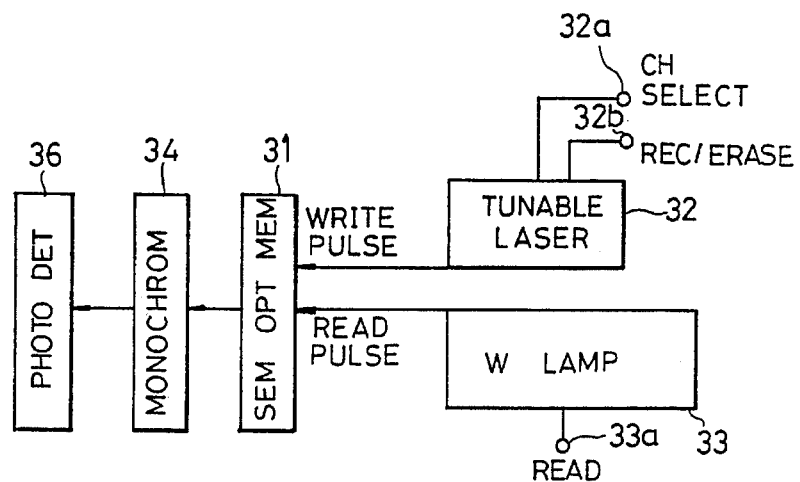
FIG.10A
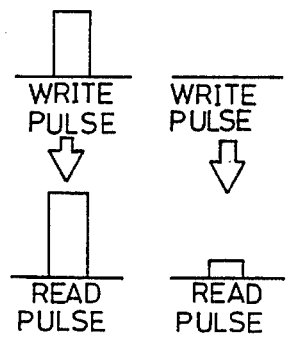
FIG.10B
FIG.10C
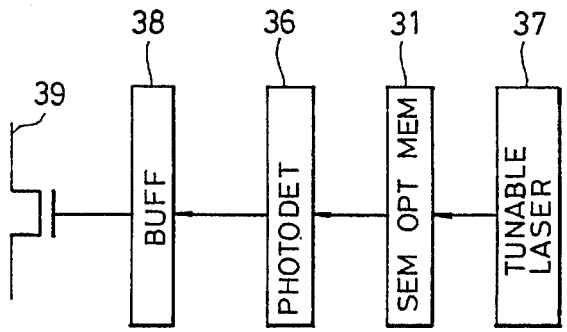
FIG.11

5,499,206

SEMICONDUCTOR OPTICAL MEMORY DEVICE FOR OPTICAL STORAGE OF INFORMATION WITH INCREASED RECORDING DENSITY

This application is a continuation of application Ser. No. 07/635,434 filed Dec. 28, 1990, now abandoned.

BACKGROUND OF THE INVENTION

The present invention generally relates to optical storage of information and more particularly to a semiconductor optical memory device and system for storing information in the form of optical data.

Various optical data storage systems are currently used for storage of large amount of data, such as optical disks or magneto-optical disks. In such optical data storage systems, it is known that there is a limitation in the recording density of data because of the relatively large wavelength of the optical beam used for the recording.

On the other hand, there is proposed a frequency selective optical data storage system in the U.S. Pat. No. 4,101,976, wherein a multiple recording of information on a common recording medium is achieved by changing the wavelength of the optical beam used for recording. This system employs the so-called photochemical hole burning effect of polymer compounds in which optical absorption of the polymer compound for the light of particular wavelength is saturated after the irradiation of an optical beam having the same wavelength.

FIGS. 1A and 1B show this photochemical hole burning effect conventionally known for the polymer compounds, wherein FIG.1A shows the absorption spectrum before the irradiation of the optical beam and FIG.1B shows the absorption spectrum after the irradiation. As can be seen in FIG.1B, there appear a number of dips or lines in the absorption spectrum in response to the wavelength of the optical beam used for the irradiation. In correspondence to each dip, the absorption coefficient of the polymer is decreased and the optical beam having the wavelength corresponding to the dip passes through the polymer. This phenomenon of photochemical hole burning is attributed to the existence of localized quantum states formed in the chemical bond of the polymer compound. Thus, when an optical beam having the energy that matches the energy level of the quantum state is irradiated, the corresponding transition of carriers is induced in the polymer compound. Once the carriers are excited, the existence of the carriers blocks the transition of other carriers to the same energy level and the polymer compound stops absorbing the optical beam of the same wavelength irradiated thereafter.

In using such a frequency selective multiple recording of optical data for the future optical computers and the like, it is desirable to produce the recording medium by a semiconductor material. With the use of the semiconductor material and the processing techniques thereof, it would be possible to design the structure of the recording medium such that an extremely large capacity of information storage is achieved by using an optical beam of which wavelength is in the convenient range. It should be noted that, by using the currently available semiconductor techniques, it would be possible to provide a large number of memory elements within a region of the focused beam spot of the optical beam that may be typically about 1 μm in diameter. Further, it would be possible to design the band structure such that the semiconductor material interacts with the optical beam of a desired frequency range.

SUMMARY OF THE INVENTION

Accordingly, it is a general object of the present invention to provide a novel and useful semiconductor optical memory device and system wherein the foregoing problems are eliminated.

Another object of the present invention is to provide a semiconductor optical memory device having an extremely large recording density.

Another object of the present invention is to provide a semiconductor optical memory device wherein a plurality of storage devices are formed in each area of the optical memory device having a size that corresponds to the wavelength of an optical beam.

Another object of the present invention is to provide a semiconductor optical memory device of a semiconductor material having a quantum well wire structure for storing information, wherein a number of quantum wells having different energy levels are formed in a recording area of the optical memory device for interaction with a writing optical beam.

Another object of the present invention is to provide a semiconductor optical memory device of a semiconductor material having a quantum well box structure for storing information, wherein a number of quantum well boxes each having different energy levels are formed in a recording area of the optical memory device for interaction with a writing optical beam.

Another object of the present invention is to provide a semiconductor optical memory device for storing information in the form of a localized modulation of optical absorption in response to an irradiation of an optical beam, comprising: a semiconductor layer having an upper major surface and a lower major surface, said semiconductor layer being formed with a plurality of elemental recording areas each having a size generally equal to a wavelength of the optical beam; and a plurality of quantized regions formed in each elemental recording area of said semiconductor layer, each of said quantized regions having a quantized energy level and absorbing an optical radiation of which wavelength is pertinent to the quantized energy level of that region; wherein each of the plurality of quantized regions in each elemental recording area has the optical absorption wavelength that is different from that of other quantized regions included in the same elemental recording area. According to the present invention, a multiple recording of information on a same elemental recording area is achieved by changing the wavelength of the optical beam. As there are a number of elemental recording areas on the device, the recording density of information is significantly increased.

Other objects and further features of the present invention will become apparent from the following detailed description when read in conjunction with the attached drawings.

BRIEF DESCRIPTION OF THE DRAWINGS

FIGS.2A–2D are diagrams showing the state density of a semiconductor crystal in various forms;

FIGS. 7A–7C are diagrams showing the essential part of the device of FIG.4 and the band structures thereof;

FIGS. 10A–10C are diagrams showing a fourth embodiment of the present invention; and FIG. 11 is a diagram showing a fifth embodiment of the present invention.

DETAILED DESCRIPTION

First, the principle of the present invention will be described with reference to FIG.2A–2D and FIG. 3A–3C.

Referring to FIG. 2A showing the distribution of the state density of electrons in the conduction band for the case of a bulk semiconductor crystal, there appears a continuous distribution of the state density g(E) that increases as a function of square root of the energy E as illustrated. A similar but inverted distribution of the state density appears also in the valence band for the holes of which illustration is omitted. In such a structure, an electron excited to the valence band in response to the absorption of a photon energy always finds a corresponding state that accepts the excited electron. In other words, such a bulk semiconductor crystal shows a continuous optical absorption spectrum. Further, the electrons thus excited upon absorption of light fall along the conduction band to the lower edge thereof, and there occurs an increase in the density of electrons near the lower edge of the conduction band. Thereby, such a bulk crystal shows the saturation of optical absorption always in the vicinity of the lower edge of the conduction band irrespective of the wavelength of the light that the crystal has absorbed.

FIG. 2B shows the distribution of the state density for the case of a so-called quantum well structure wherein the electrons are confined in a substantially two-dimensional planar area having a reduced thickness typically less than about 100 Å. In such a structure, there appears a stepwise increase in the state density in the conduction band as illustrated. As will be understood from the previous consideration with respect to the bulk crystal, this structure, too, shows a continuous optical absorption spectrum and the saturation at the lower edge of the conduction band.

Figure 3A:
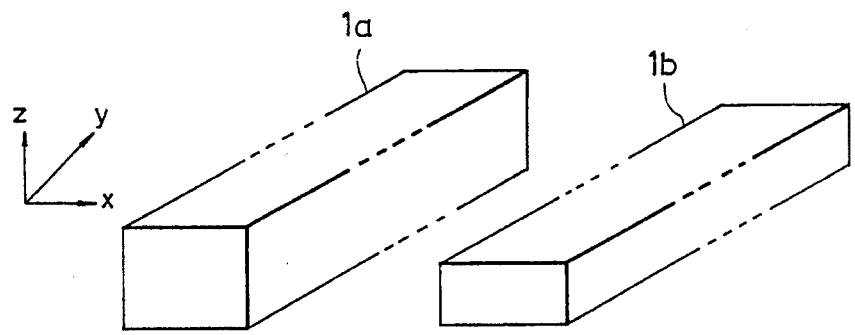
FIGS.3A–3C are diagrams showing quantum well wires, quantum well boxes and corresponding energy diagrams.

FIG. 2C, on the other hand, shows the state density distribution for the case of a so-called quantum well wire structure wherein the electrons are confined in a substantially one-dimensional, elongated wire-like region shown in FIG. 3A. In FIG. 3A, there are shown two examples of the quantum well wire, $1a$ and $1b$, in which the size thereof in the x-direction and y-direction is made different between the quantum well wire $1a$ and the quantum well wire $1b$. In such a case of the quantum well wire, there appear a plurality of maxima in the state density as shown in FIG. 2C and thus, the energetical distribution of the electrons and holes is substantially quantized in the conduction band and in the valence band except of course for the tails that accompany with each quantum level.

Figure 3B:
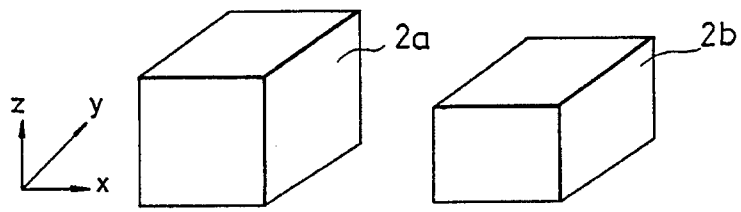
Figure 3C:
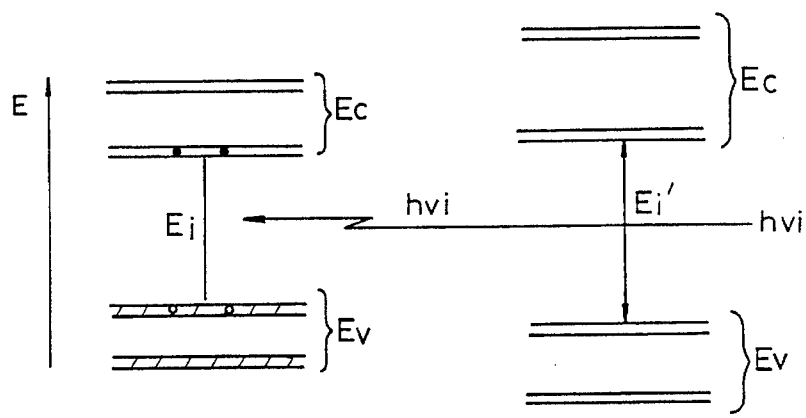

FIG. 3C schematically shows the energy level diagram of the electrons thus formed in such quantized structures $1a$ and $1b$. As shown in FIG. 3C, when there is an incident optical beam of which energy hvi matches with the energy gap Ei of the quantum well wire $1a$, the electrons in the valence band of the quantum well wire $1a$ are excited from the quantum level of the valence band to the quantum level of the conduction band. Once excited, the electrons remain at the quantum state and there occurs an accumulation of electrons in the quantum state. In correspondence to this quantization, the structure shows substantially discrete optical absorption peaks in correspondence to each quantum level. Further, such a structure substantially restricts the continuous decrease in the energy of electrons from one quantum level to another quantum level because of the reduced state density intervening therebetween, although not as complete as in the case of the completely quantized case of FIG. 3C. In other words, such a quantum well wire structure shows a saturation in the optical absorption in correspondence to each absorption peak when subjected to an irradiation of optical beam.

Further, FIG. 2D shows the state density distribution for the case of a so-called quantum well box structure wherein the electrons are confined in a three-dimensionally isolated structure as shown in FIG. 3B. In FIG. 3B, two quantum well boxes $2a$ and $2b$ that differ in size from each other in the x-, y- and z-directions are shown. In such a case of the quantum well box, the splitting of the state density into discrete quantum levels is complete and there appears a clear quantized structure exactly corresponding to the structure of FIG. 3C. Thereby, a number of isolated absorption lines appear in the absorption spectrum in correspondence to each quantum level. With this regard, the quantum well box structure is similar to the quantum well wire structure, except that the absorption peak observed for the quantum well box structure is much more sharp as compared to the absorption peak in the case of the quantum well wire structure. Further, the quantum well box structure substantially prohibits the transition of electrons across these discrete quantum levels. Thereby, the electrons excited to the quantum levels in response to the absorption of optical beam remains there, and the saturation of optical absorption occurs at the same wavelength of the optical beam that was absorbed.

It should be noted that, when the quantum well wire $1a$ and the quantum well wire $1b$ of FIG. 3A are formed adjacent with each other, the optical beam having the energy hvi interacts only with the quantum well wire $1a$ and not with the quantum well wire $1b$ because of the transition energy Ei' of the quantum well wire $1b$ not matching the energy hvi of the incident optical beam.

Thus, by forming a number of quantum well wires each having a size in the x- and y-directions that is different from other quantum well wires on a same semiconductor substrate, it would be possible to cause a transition of the electrons selectively in one quantum well wire by irradiating an optical beam of which wavelength is selected variously. Once the transition occurs in such a quantum well wire, the accumulation of the electrons occurs in the quantum level of the excited state as already described and there appears a saturation of absorption of the optical beam that is irradiated thereafter. In other words, a selective optical writing of information would be possible by using such a structure.

Figure 4:
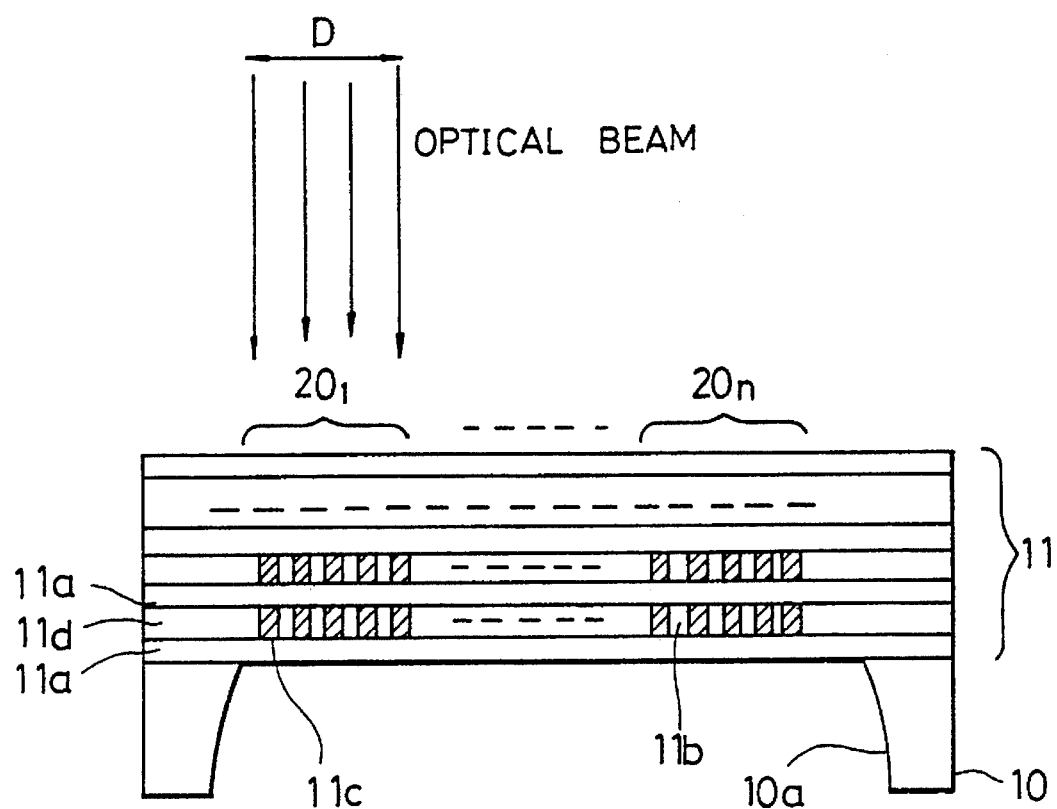
FIG. 4 is a cross-sectional view showing the general construction of the semiconductor optical memory device according to a first embodiment of the present invention.

FIG. 4 shows a first embodiment of the present invention for embodying the foregoing concept of the present invention.

Referring to FIG. 4 showing a semiconductor optical memory in the cross-sectional view, the semiconductor optical memory comprises a gallium arsenide substrate 10 having a thickness of about 500 μm for providing a mechanically rigid support of the structure to be formed thereon, and a window or aperture 10a provided in the substrate 10 with a size of about 5 mm in diameter for passing the optical beam therethrough.

On the substrate 10, there is provided a layered body 11 comprising a repetitive stacking of an AlGaAs layer 11a and a layer 11d, wherein a number of quantized regions 11c of GaAs are formed in each stack of the layer 11d with a separation from other quantized regions in the same layer. Of course, each quantized region 11c in any one of the layers 11d is isolated from other quantized regions 11c in other layer 11d by the intervening AlGaAs layer 11a. The thickness of the layer 11d is set less than about 100 Å and changed stack by stack, either variously or systematically such that a number of quantum levels, each characterized by a transition energy that changes stack by stack, appear in the layered body 11. In a typical example, the thickness of the layer 11b is changed from 25 Å to 50 Å in 100 steps.

Figure 1A:
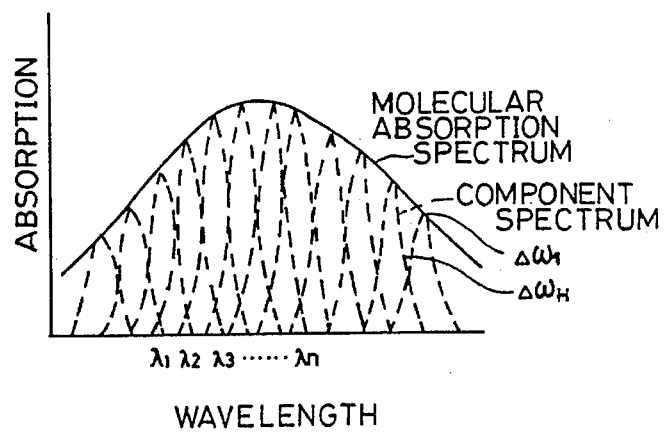
FIGS. 1A and 1B are diagrams showing the conventional photochemical hole burning effect observed for polymer compounds.
Figure 5A:
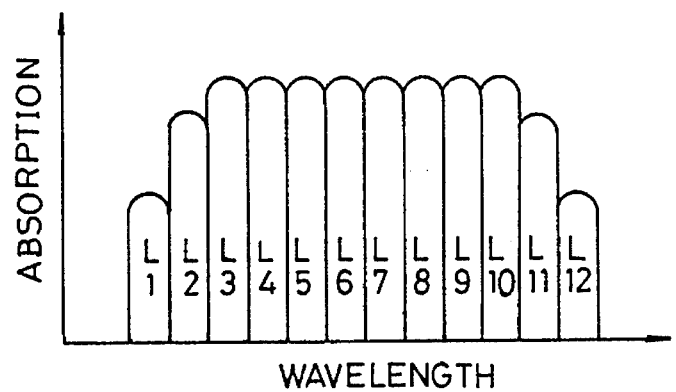
FIGS. 5A and 5B are diagrams showing the absorption spectrum achieved by the device of FIG.4.
Figure 5B:
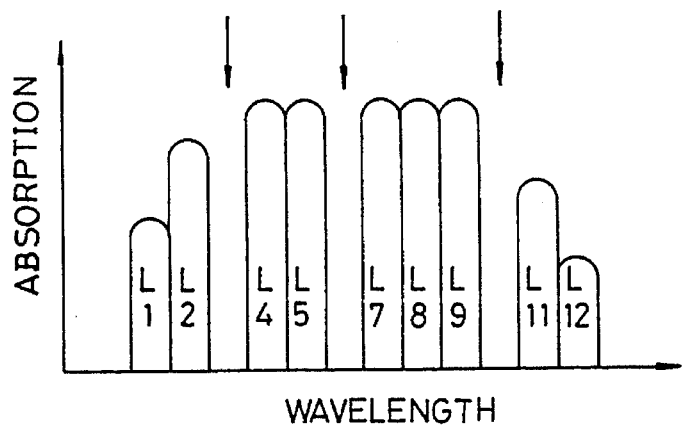

When writing data, the layered body 11 is irradiated by a focused optical beam that may typically have a beam diameter D corresponding to the wavelength of the optical beam while changing the wavelength variously. For example, the optical beam may be produced by a dye laser that oscillates in a number of channels such as L1–L12 each corresponding to a particular wavelength. It should be noted that, when viewed in the direction of the optical beam, a number of quantized regions 11c having various transition energies are included in the area such as areas $20_1$–$20_n$ of the layered body 11 that is hit by the optical beam. Thereby, a substantially continuous absorption spectrum appears as shown in FIG. 5A when the wavelength of the optical beam is changed by selecting the channels L1–L12. In view of the possible variations in the energy levels in each quantized region, the absorption spectrum of each stack has a finite, somewhat broadened width and the spectrum of FIG. 5A becomes indeed continuous, like the spectrum shown in FIG. 1A. In response to the irradiation of the optical beam of a selected channel such as the channels L3, L6 and L10, there is formed a saturation of optical absorption in the quantum regions that interact with the optical beam of these wavelengths, and the absorption spectrum changes as shown in FIG. 5B. Here, each channel represents one bit of data. In a typical example, about $10^8$ of such elemental recording areas are formed in 1 cm$^{-2}$ of the layered body 11, and about $10^3$–$10^4$ of the quantized regions are formed in each elemental recording area. The total range of wavelength thus achieved in the absorption spectrum of FIG. 5A may be about 200 meV, with each channel separated from an adjacent channel by about 1 meV.

Next, a more detailed construction of the first embodiment layered body 11 will be described in relation to the fabrication process thereof.

Figure 6A:
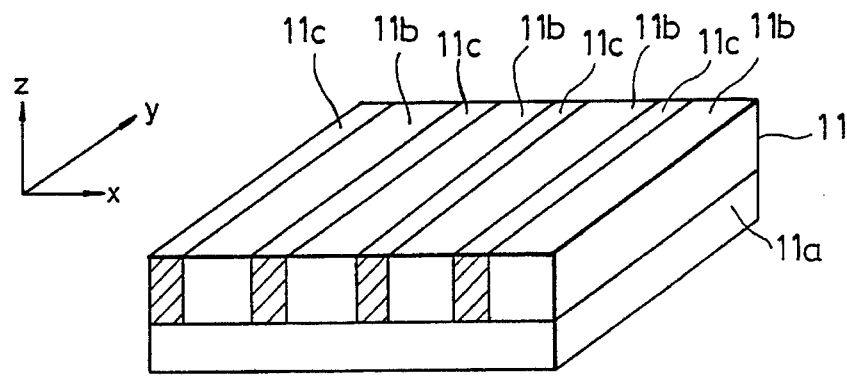
FIGS. 6A–6F are diagrams showing the processes for fabricating the essential part of the device of FIG.4.

FIG. 6A shows one stack of the layered body 11 of FIG. 4. As shown therein, the stack comprises the layer 11a of AlGaAs and the layer 11b of AlAs, and the elongated quantum well wire 11c of GaAs is formed in the layer 11d to extend parallel with each other in the y-direction.

Figure 6B:
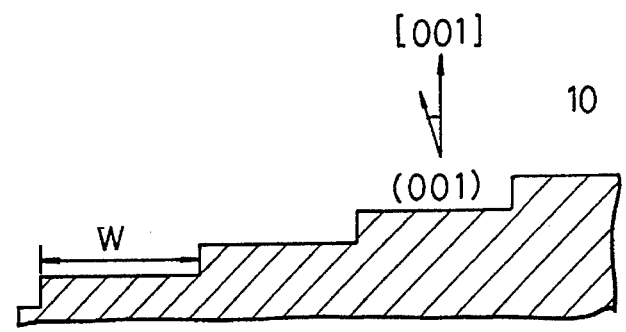

FIG. 6B shows a first step of forming the stack of FIG. 6A, wherein the substrate 10 is prepared to have an inclined crystal surface that is offset from the [001] direction by 1.0 degree in the [01$\bar{1}$] or [0$\bar{1}$1] direction. As is commonly known in the art, such an offset crystal surface is characterized by a number of stepped surfaces each comprising a strip-like (001) surface having a step width W corresponding to 55 atomic layers of Ga. Further, a GaAs or GaAlAs buffer layer not illustrated is deposited on the substrate 10 and the foregoing stepped structure of the substrate is transferred to the surface of the buffer layer.

Figure 6C:
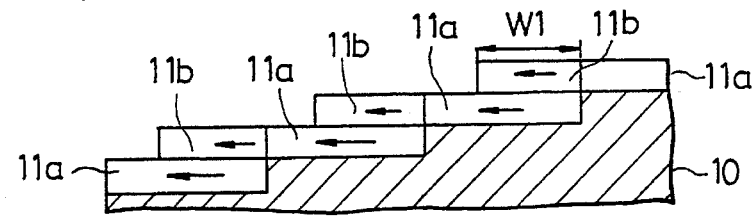

In the step of FIG. 6C, the AlGaAs layer 11a is deposited on each step of the GaAs substrate 10 by the growth process. Thereby, the layer 11a grows laterally from the edge of the step as shown by the arrow for the entire step width W, and a new stepped surface is formed on the AlGaAs layer 11a. After the layer 11a grown as such, the AlAs layer 11b is grown laterally, starting from the edge of the newly formed step and proceeding in the direction of the arrow similar to the case of growing the layer 11a. In growing the layer 11b, the growth is interrupted when 36 aluminum layers are formed in the layer 11b thus grown. Thereby, each step of the layer 11b has a width W1 corresponding to the 36 aluminum layers in AlAs.

After the layers 11a and 11b thus formed, the GaAs layer 11c is grown also by the growth process on the stepped surface of FIG. 6C by changing the source gas. Thereby, the GaAs layer 11c is grown laterally, starting from the edge of the AlAs layer 11b for a width W2 that corresponds to 19 gallium layers in GaAs and the structure shown in FIG. 6D is obtained.

Figure 6D:
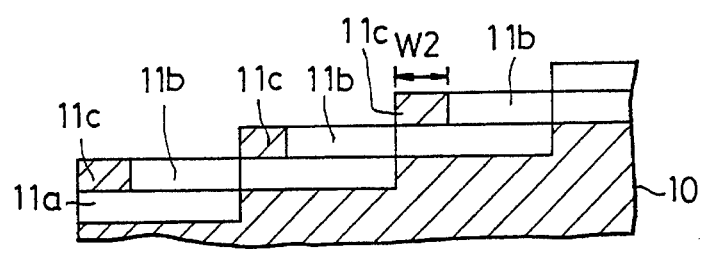
Figure 6E:
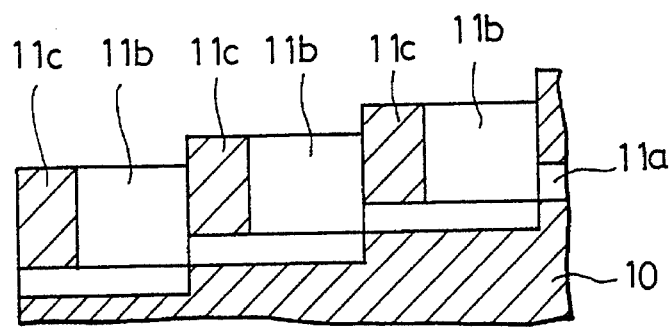

Further, by repeating the processes of FIG. 6C and FIG. 6D by a number of times, the AlAs layer 11b and the GaAs layer 11c are grown in the z-direction as shown in FIG. 6E and the structure shown in FIG. 6A is obtained. In this structure, the GaAs layer 11c is laterally bounded by the AlAs layers 11b and looks like an elongated region rather than layer. As will be described later with reference to the band structure of FIGS. 7B and 7C, this elongated region 11c forms a quantum well wire. Because of this reason, the layer 11c will be referred to hereinafter as a region or sometimes quantum well wire. In correspondence to this, the layers 11b will be referred to as confinement regions. It should be noted that, in FIG. 6A, the steps that appear on the surface is omitted.

Figure 6F:
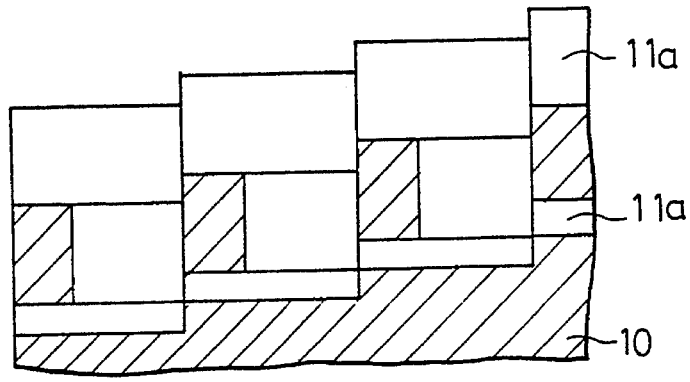

On the structure of FIG. 6E, there is formed another AlGaAs layer 11a of the next stack as shown in FIG. 6F, and the foregoing processes of FIGS. 6C–6F are repeated by a number of times in each stack of the layered body 11. Thereby, the structure shown in FIG. 7A is obtained. In FIG. 7A, it should be noted that, by changing the number of repetitions in the steps of FIGS. 6C and 6D in each stack, the thickness t1, t2, t3 of the confinement regions 11b and hence the quantum well 11c in each stack can be changed as desired.

FIGS. 7B and 7C show the band structure of the layered body 11 of FIG. 7A thus formed, wherein FIG. 7B shows the band structure taken in the z-direction and FIG. 7C shows the band structure taken in the x-direction. As shown in FIG. 7B, the GaAs region 11c is laterally sandwiched by the AlAs confinement regions 11b that have a band gap substantially larger than that of GaAs and vertically by the AlGaAs layers 11a that also have a wide band gap and acting as a confinement layer that confines the carrier in the GaAs region 11c. Thereby, the GaAs region 11c forms the quantum well wire characterized by the transition energy Ei. In the structure of FIG. 7A, the transition energy is changed in each stack as Ei, Ei' and Ei", due to the foregoing systematic change in the thickness t1, t2 and t3 of the stacks. Thus, each stack of the layered body 11 interacts with the optical beam of particular wavelength, and the layered body 11 itself shows the substantially continuous absorption spectrum shown in FIG. 5A. As already noted with reference to FIGS. 5A and 5B, in such a quantum well wire, the hole burning effect appears in each quantum level and thus in each stack of the layered body 11. Thereby, the recording of information is made at various levels or depths of the layered body depending on the wavelength of the optical beam.

FIG. 7C shows the band structure of the layered body 11 taken in the x-direction. When all the stepped surfaces formed on the surface of the GaAs substrate 10 in the first step of FIG. 6B have an exactly identical width W and when the growing processes of FIGS. 6C and 6D are controlled ideally, each GaAs quantum well 11c has a same width W2 and an exactly identical quantum structure characterized by an identical transition energy Ej is repeated in the x-direction as illustrated. Thereby, one optical absorption wavelength is assigned to one stack in the layered body 11. In the actual case, however, the width W2 of the GaAs quantum well wire 11c is not exactly identical in the stack but changes variously in the x-direction. Thereby, there appears a corresponding change in the transition energy Ej in the x-direction in each stack. Such a variation in the transition energy in turn causes a variation in the wavelength of the optical absorption within each stack, and the absorption spectrum indeed becomes continuous. Thereby, the recording density is further increased.

Figure 8A:
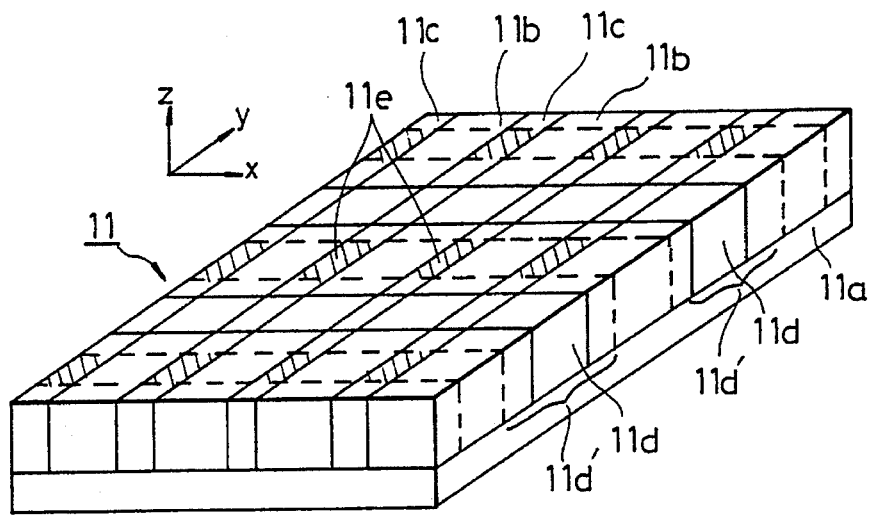
FIGS. 8A and 8B are diagrams showing a second embodiment of the present invention.
Figure 8B:
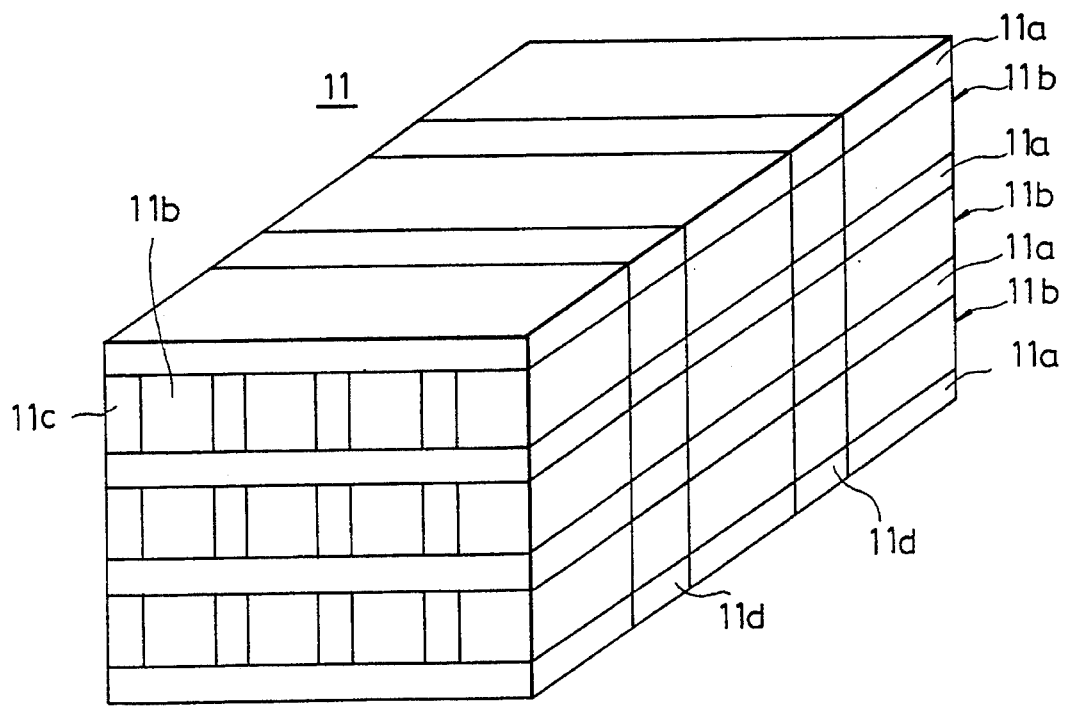

FIGS. 8A and 8B show a second embodiment of the present invention for exploiting the last mentioned feature for increasing the recording accuracy further.

Referring to FIG. 8A, the present embodiment uses the layered body 11 similar to the one used in the first embodiment as a basic structure, wherein each quantum well wire 11c in the layered body 11 is sectioned into a number of isolated quantum well boxes 11e by a focused ion beam implantation of Ga. In FIG. 8A, the region designated by 11d extending in the y-direction represents such a region formed by the ion implantation. The region 11d may be formed with a pitch of about 1000 Å in the y-direction, and after the annealing process accompanying the ion implantation, the Ga atoms thus implanted cause a mutual diffusion with Al atoms. Thereby, a wide band gap region 11d' is formed at both sides of the implanted region 11d. Accompanying with the lateral spreading of the wide band gap region 11d, the size of the quantum well box region 11e is reduced in the y-direction to the order of about 100 Å or less. When the size in the y-direction is decreased below about 100 Å, the three-dimensional confinement of the carriers becomes effective and the formation of the band structure pertinent to the quantum well box shown in FIG. 2D becomes appreciable. By suitably changing the pitch of the region 11d, one can form a number of energetically different quantum well boxes 11e in one elemental recording area such as the area $20_1$ (FIG.4).

One advantage in this approach is that one does not need extremely high precision of ion implantation for forming the regions 11d and thus the regions 11d'. Instead, minor variation in the size of the quantum well box occurring naturally at the time of formation of the quantum well box is preferred, as such a variation increases the width of the spectral lines of optical absorption and hence the recording density. In other words, the structure of FIG. 8A is relatively easy to fabricate by the presently available fabrication process of semiconductor devices.

By stacking the structure of FIG. 8A in the z-direction for a number of layers, the structure shown in FIG. 8B is obtained. In forming the structure of FIG.8B, the thickness of each stack may be changed similar to the case of the first embodiment. Such a layered body 11 includes a very large number of quantum well boxes 11e in one elemental recording area $20_1$–$20_n$ and thus characterized by a very large recording density.

Any layered body of the first and second embodiments may be used to form the structure of FIG. 4, wherein the GaAs substrate 10 is subsequently subjected to an etching process that selectively removes GaAs relative to GaAlAs, and the window 10a is formed to pass the optical beam. This process of etching could be eliminated if one can use a wide band gap material that does not interact with the optical beam for the substrate 10. It should be noted that the process of the focused ion beam implantation is not necessarily be applied to each stack separately but may be achieved simultaneously for a number of stacks. For example, the ion implantation of the focused ion beam may be applied to the stacked structure of FIG. 8A. Thereby, the quantum well boxes 11e are formed in a reduced number of steps. Further, it should be noted that the structure of the quantum well wire shown in FIG. 6A or 7A may be formed by the focused ion beam implantation process.

Next, a third embodiment of the present invention for increasing the lifetime of the information recorded in the semiconductor optical memory device will be described with reference to FIGS. 9A and 9B. It should be noted that when the electrons and holes are excited in response to the absorption of an optical beam, these electrons and holes may disappear in the meantime because of the recombination. Thus, in order to increase the lifetime of the information recorded in the semiconductor optical memory device, a refreshing operation of memory has been needed. Against this conventional situation, the present embodiment proposes a device that provides an extended lifetime of the information stored by disturbing the recombination of the electrons and holes.

Figure 9A:
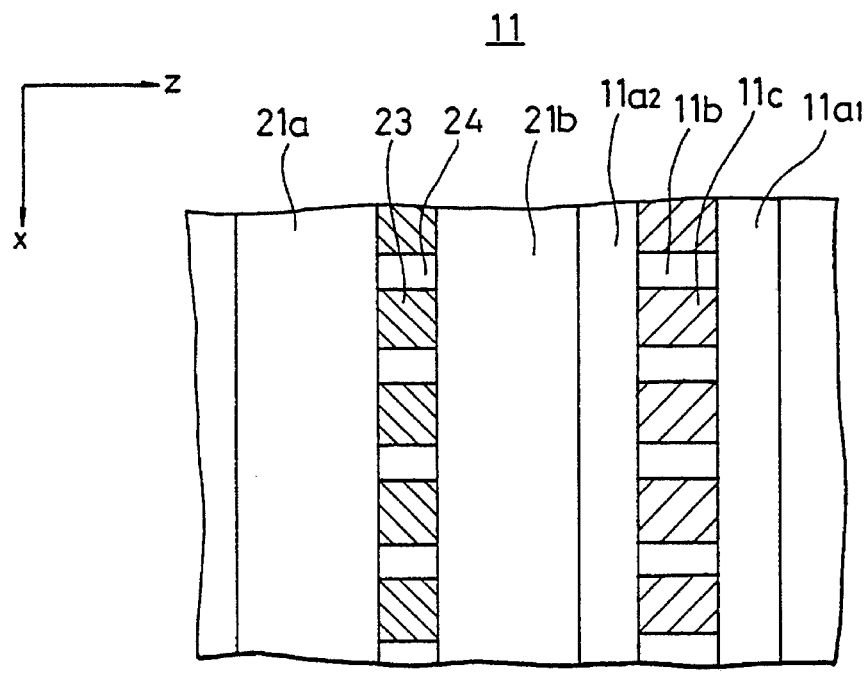
FIGS. 9A and 9B are diagrams showing a third embodiment of the present invention.

Referring to FIG. 9A showing a part of the stack in the layered body 11, the stack comprises the quantum well wire 11c of InGaAs laterally sandwiched in the x-direction by the confinement regions 11b of InAlAs, and the quantum well wire 11c is further sandwiched in the z-direction by a pair of confinement layers 11a1 and 11a2 which may have a composition of InAlAs0.6.AlAsSb0.4. The quantum well wire 11c and the confinement regions 11b may have a thickness of 50 Å in the z-direction, and the confinement layers 11a1 and 11a2 also have a thickness of 50 Å in the z-direction. As will be described later, the thickness of the confinement layer 11a2 is chosen to allow tunneling of holes through the layer 11a1.

Adjacent to the foregoing structure, there is provided another quantum well wires 23 of GaAsSb having a thickness of 50 Å in the z-direction and sandwiched in the x-direction by a pair of confinement regions 24 of InAlAs0.6.AlAsSb0.4 with a thickness of also 50 Å in the z-direction. Further, the quantum well wire 23 and the confinement regions 24 are sandwiched in the z-direction by a pair of confinement layers 21a and 21b of AlAsSb that have a thickness of 200 Å in the z-direction. It should be noted that the confinement layer 21b is provided directly adjacent to the confinement layer 11a2.

Figure 9B:
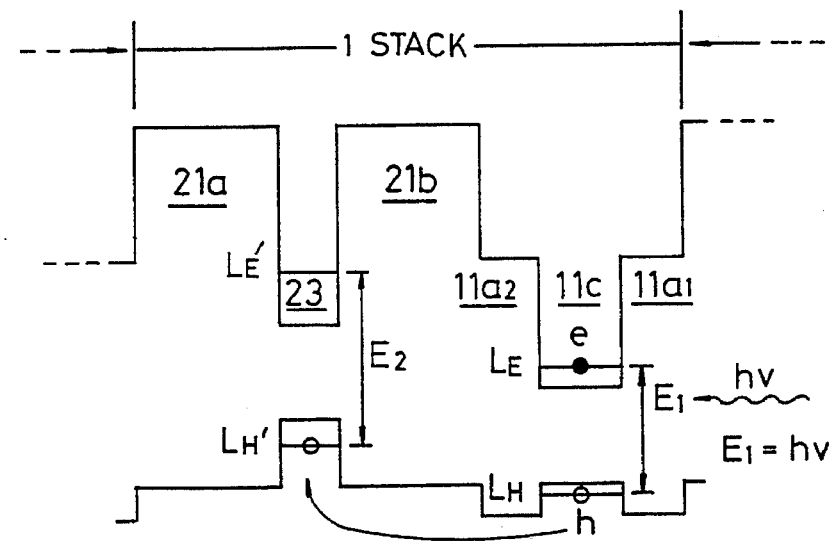

FIG. 9B shows the band structure corresponding to the structure of FIG. 9A.

Referring to FIG. 9B, the structure defined as such forms discrete quantum levels LH and LE in the quantum well wire 11c and quantum levels LH' and LE' in the quantum well wire 23, wherein the quantum levels LH and LE in the quantum well wire 11c are characterized by a transition energy E1 and the quantum levels LH' and LE' in the quantum well wire 23 are characterized by a transition energy E2 that is larger than E1. Upon incidence of the optical beam having an energy coincident to the energy E1, electrons are excited to the quantum level LE in the quantum well wire 11c while holes are formed in correspondence thereto in the quantum level LH. On the other hand, excitation of the electrons to the conduction band does not occur in the quantum well wire 23. It should be noted that the quantum level LH' formed in the valence band of the quantum well wire 23 is energetically much higher than the quantum level LH of holes thus formed in the quantum well wire 11b. In terms of the energy of holes, this means that the quantum level LH' has an energy much lower than the quantum level LH. Thereby, the holes at the quantum well wire 11c tunnel through the confinement layer 11a2 and fall into the quantum level LH', crossing through the confinement layer 21b. It should be noted that the confinement layer 11a2 acting as the barrier to the holes has the thickness of only 50 Å and allows free passage of holes therethrough. On the other hand, the confinement layer 21b has the edge of the valence band that is lower than the quantum level LH in terms of the energy of holes and does not obstruct the passage of the holes. On the other hand, the transfer of the electrons from the quantum well wire 11c to the quantum well wire 23 does not occur, as the quantum level LE' for the electrons has the energy that is much higher than the quantum level LE.

Thereby, the electrons remain in the quantum well wire 11c while the holes alone are transferred to the quantum well wire 23. With such a spatial separation of the electrons and holes, the recombination thereof is deterred and the electrons remain stable in the quantum well wire 11c. Thus, there appears a stable accumulation of electrons in the quantum level LE of the quantum well wire 11c and the layered body 11 shows the hole burning effect once the body 11 is written with information by the writing optical beam.

When erasing the record, on the other hand, a relatively low energy optical beam that causes the transition of the holes out from the quantum well wire 23 is irradiated. Thereby, the holes thus excited return to the quantum well wire 11c with a finite probability, and once returned, they cause the recombination with the electrons therein and disappear. Thus, by irradiating the low energy optical beam for a finite time period, substantially all the holes in the quantum well wire 23 can be annihilated. In the case that the semiconductor optical memory device does not have the structure of FIG. 9A, the erasure of the record is achieved immediately when the refreshing of record is stopped.

It should be noted, of course, that the foregoing processes for extending the lifetime of recording hold true also in the case of the quantum well box structure. As the formation of the quantum well box starting from the structure of FIG. 9A is obvious from the previous description made with reference to FIG. 8A, further descriptions thereof will be omitted.

FIG. 10A shows the optical information reading and writing system that utilizes the semiconductor optical memory of the present invention.

Figure 1B:
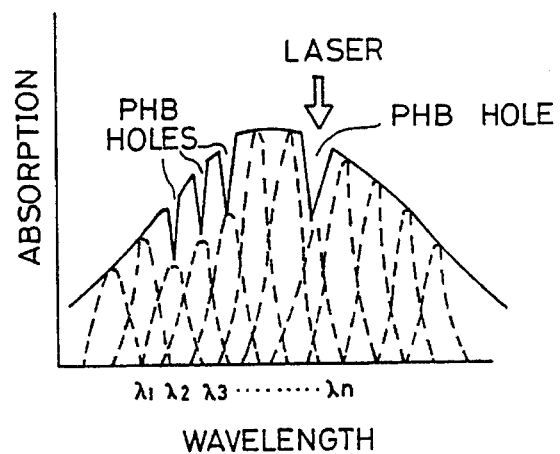

Referring to FIG. 10A, the system comprises a tunable laser 32 that may be a dye laser such as the Spectra-Physics Model 375B that changes the oscillation wavelength in the range of 705–940 nm. The laser 32 produces a writing laser beam in response to a channel selection signal supplied to an input terminal 32a and a write enable signal supplied to another input terminal 32b and directs the laser beam thus produced to a desired elemental recording area of the semiconductor optical memory device 31. The semiconductor optical memory may have the construction of any of the first through third embodiments and has a substantially continuous absorption spectrum shown in FIG. 5A that is similar to the conventional polymer recording medium shown in FIG. 1A. Thereby, there is formed a dip in the absorption spectrum as shown in FIG. 1B or FIG. 5B in response to the irradiation of the writing laser beam representing the information written therein. The control of the laser beam to the desired elemental recording area is achieved by the well known, conventional control system, particularly when the device 31 is constructed into a disk-shape, and the description thereof will be omitted.

When reading the information, the laser 32 is disabled and a light source 33 producing a white light beam having a continuous spectrum such as tungsten lamp is energized in response to a read enable signal supplied to the light source 33, and the light beam is directed to the desired elemental recording area. The light source 33 produces the light with reduced intensity and thus, the hole burning effect does not occur in the absorption spectrum at the time of reading. The light beam that has passed through the device 31 is received by a monochrometer 34 and detected by an optical detector 36.

When erasing the information from the device 32, the wavelength of the laser beam produced by the laser 32 is changed, in response to an erase enabling signal to the terminal 32b, to a longer wavelength that causes the transition of the holes in the quantum well wire 23. Thereby, the electrons in the quantum well wire 11c is quickly annihilated by the recombination with the holes and the saturation of absorption in the spectrum disappears immediately. Alternatively, the temperature of the semiconductor optical device 31 may be raised such that the holes are excited to the outside of the quantum well wire 23. In this case, erasing of the entire data in the device 31 can be possible by one step.

FIGS. 10B and 10C are diagrams showing the reading of information in the system of FIG. 10A, wherein FIG. 10B shows the write pulse for the case where the information is written (left) and for the case where the information is not written (right). In corresponding to this, FIG. 10C shows the read pulse detected by the detector 36 for the case where the information is written (left) and for the case where the information is not written (right). Thus, when the information is written (left), the detector 36 detects a strong optical read pulse because of the decrease in the absorption by the device 31, while when the information is not written (right), the detector 36 detects a weak or faint optical read pulse.

The system of FIG. 10A may be used in various industrial fields other than the optical information processing and optical computers. FIG. 11 shows an example of the construction of an optically activated switch, wherein a transistor 39 is driven in response to the output of the optical detector via a buffer circuit 38. The semiconductor optical memory device 31 is written with information previously, and the transistor 39 is driven according to the information stored therein upon irradiation by the tunable laser 37.

Further, the present invention is not limited to the embodiments described heretofore, but various variations and modifications may be made without departing from the scope of the invention.

What is claimed is:

1. A semiconductor optical memory device for storing information in the form of a localized modulation of optical absorption, comprising:

a semiconductor layer having an upper major surface and a lower major surface, said semiconductor layer extending in first and second, mutually perpendicular directions; and a plurality of quantized regions formed in said semiconductor layer, each of said quantized regions having first and second sizes in said first and second directions respectively, each said quantized region further having a third size in a third direction perpendicular to any of said first and second directions, at least two of said first through third sizes being set sufficiently small in each said quantized region such that a quantized energy level is formed in each of said quantized regions, each said quantized region thereby absorbing an optical radiation of which wavelength is pertinent to the quantized energy level of said quantized region by exciting first type carriers having a first polarity and second type carriers having a second, opposing polarity, each of said quantized regions comprising a first semiconductor material confined in at least two of said first through third directions to form said quantized energy level;

wherein each of the plurality of quantized regions has the optical absorption wavelength that is different from that of other quantized regions included in a common elemental recording area and wherein each of said quantized regions is separated from the other quantized regions, with respect to the directions in which the size of the quantized region are limited, by a second semiconductor material that has a band gap larger than that of the first semiconductor material forming the quantized region.

2. A semiconductor optical memory device as claimed in claim 1 in which said each quantized region comprises a quantum well wire of the first semiconductor material extending in said first direction and confined in said second and third directions.

3. A semiconductor optical memory device as claimed in claim 2 in which, in each elemental recording area, there are provided a plurality of said quantum well wires each having a size that is different in at least one of the second and third directions from adjacent quantum well wires in said each elemental recording area.

4. A semiconductor optical memory device as claimed in claim 1 in which said each quantized region comprises a quantum well box of the first semiconductor material isolated with each other in a three-dimensional space defined with respect to said first, second and third directions to form said quantized energy level.

5. A semiconductor optical memory device as claimed in claim 4 in which there are provided a plurality of said quantum well boxes each having a size that is different at least in one of the first, second and third directions from the other quantum well boxes.

6. A semiconductor optical memory device as claimed in claim 4 in which said each quantum well box is separated from the other quantum well boxes in each of said first through third directions by the second semiconductor material that has a band gap substantially larger than that of the first semiconductor material forming the quantum well box.

7. A semiconductor optical memory device as claimed in claim 1 further comprising a conjugate quantized region in correspondence to said each quantized region, said conjugate quantized region being provided adjacent to the corresponding quantized region so as to allow a transfer of the first type carriers from the quantized region to the conjugate quantized region while prohibiting a transfer of the second type carriers from the quantized region to the conjugate quantized region, said conjugate quantized region being formed such that the first type carriers assume a state energetically more stable than in the quantized region.

8. A semiconductor optical memory device as claimed in claim 7 in which said each quantized region is separated from adjacent conjugate quantized region by an energy barrier that has a thickness allowing a tunneling of the first type carriers therethrough.

9. A semiconductor optical memory device as claimed in claim 7 in which said each quantized region is confined by the second semiconductor material that has a band gap larger than that of the first semiconductor material forming the quantized region, said each conjugate quantized region is confined by a third semiconductor material that has a band gap larger than that of a semiconductor material forming the conjugate quantized region, wherein said second semiconductor material and said third semiconductor material are formed adjacent with each other such that the quantized region is separated from the conjugate quantized region by the second semiconductor material and the third semiconductor material, wherein said second semiconductor material has a thickness, in an area between the quantized region and the conjugate quantized region, to allow the transfer of the first type carriers therethrough by tunneling while said third semiconductor material has an energy level of the first type carriers that is lower than an energy level of the quantized region.

10. An optical information storage system, comprising:

tunable light source means supplied with a write command signal for producing a first optical beam with a wavelength selected from a range of wavelengths in response to the write command signal;

continuous light source means supplied with a read command signal for producing a second optical beam having a continuous spectrum in said range of wavelengths;

a semiconductor optical memory device provided to be irradiated by the first optical beam of the tunable light source means and by the second optical beam of the continuous light source means, said semiconductor optical memory device comprising:
a semiconductor layer having an upper major surface and a lower major surface, said semiconductor layer extending in first and second, mutually perpendicular directions, said semiconductor layer being formed with a plurality of elemental recording areas each having a size generally equal to the wavelength of the first optical beam; and a plurality of quantized regions formed in said each elemental recording area of said semiconductor layer, each of said quantized regions having first and second sizes in said first and second directions respectively, each said quantized region further having a third size in a third direction perpendicular to any of said first and second directions, at least two of said first through third sizes being set sufficiently small in each said quantized region such that a quantized energy level is formed in each said quantized region as a result of confinement of the sizes of said quantized region, each said quantized region thereby absorbing an optical radiation of which wavelength is pertinent to the quantized energy level of that quantized region by forming first type carriers having a first polarity and second type carriers having a second, opposing polarity, each of said quantized regions comprising a semiconductor material confined in at least two mutually perpendicular directions to form said quantized energy level; each of the plurality of quantized regions in said each elemental recording area having the optical absorption wavelength that is different from that of other quantized regions included in the same elemental recording area; each of said quantized regions being separated from the other quantized regions, with respect to the directions in which the size of the quantized region are limited, by a semiconductor material that has a band gap larger than that of the semiconductor material forming the quantized region; and photodetection means provided to receive the optical beam produced by the continuous light source means and passed through the semiconductor optical memory device for detecting the wavelength of the received optical beam.

* * * * *